(12) United States Patent
Boecking

(10) Patent No.: US 7,276,837 B2
(45) Date of Patent: Oct. 2, 2007

(54) PIEZOELECTRIC ACTUATOR

(75) Inventor: Friedrich Boecking, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 138 days.

(21) Appl. No.: 10/539,727

(22) PCT Filed: Jul. 10, 2003

(86) PCT No.: PCT/DE03/02315

§ 371 (c)(1),
(2), (4) Date: Jun. 20, 2005

(87) PCT Pub. No.: WO2004/061986

PCT Pub. Date: Jul. 22, 2004

(65) Prior Publication Data

US 2006/0125353 A1 Jun. 15, 2006

(30) Foreign Application Priority Data

Dec. 20, 2002 (DE) .................. 102 59 949

(51) Int. Cl.
*H01L 41/083* (2006.01)
(52) U.S. Cl. ..................... 310/328; 310/366
(58) Field of Classification Search ............ 310/328, 310/366
See application file for complete search history.

(56) References Cited

U.S. PATENT DOCUMENTS

| | | | | |
|---|---|---|---|---|
| 5,761,782 A | * | 6/1998 | Sager | .................. 29/25.35 |
| 6,316,863 B1 | * | 11/2001 | Schuh et al. | ................. 310/328 |
| 6,411,018 B1 | * | 6/2002 | Heinz | ......................... 310/363 |
| 6,507,140 B1 | * | 1/2003 | Heinz et al. | ................. 310/366 |
| 6,930,438 B2 | * | 8/2005 | Cramer et al. | ............... 310/328 |
| 7,065,846 B2 | * | 6/2006 | Schreiner et al. | .......... 29/25.35 |
| 2002/0043901 A1 | * | 4/2002 | Kihara et al. | ................ 310/366 |
| 2002/0135275 A1 | | 9/2002 | Heinz et al. | |

FOREIGN PATENT DOCUMENTS

| | | | | |
|---|---|---|---|---|
| DE | 3330538 A1 | * | 3/1985 | ................. 310/366 |
| DE | 197 53 930 A1 | | 6/1999 | |
| DE | 100 26 005 A1 | | 12/2001 | |
| DE | 101 12 588 C1 | | 5/2002 | |
| DE | 101 13 744 A1 | | 6/2002 | |
| EP | 0 584 842 A2 | | 2/1994 | |
| JP | 4268775 | * | 9/1992 | |

* cited by examiner

Primary Examiner—Thomas M. Dougherty
(74) Attorney, Agent, or Firm—Ronald E. Greigg

(57) ABSTRACT

A piezoelectric actuator has a multilayered structure of piezoelectric layers with inner electrodes interspersed between them and a contacting of the inner electrodes on alternating sides by means of outer electrodes that can supply an electrical voltage. The respective outer electrodes are attached in a net-like, mesh-like, or screen-like fashion and contacts the respective inner electrodes at least at points in the corner region of the piezoelectric actuator, wherein the outer electrode is guided around the respective corner in a predetermined region extends in the direction of the multi-layered structure of piezoelectric layers, and is provided with a terminal there.

18 Claims, 1 Drawing Sheet

US 7,276,837 B2

PIEZOELECTRIC ACTUATOR

CROSS-REFERENCE TO RELATED APPLICATIONS

This application is a 35 USC 371 application of PCT/DE 03/02315 filed on Jul. 10, 2003.

BACKGROUND OF THE INVENTION

1. Field of the Invention

The invention relates to an improved piezoelectric actuator, for example for actuating a mechanical component such as a valve or the like.

2. Description of the Prior Art

It is generally known that the so-called piezoelectric effect can be used to produce a piezoelectric element comprised of a material with a suitable crystalline structure. When an external electrical voltage is applied, a mechanical reaction of the piezoelectric element occurs, which produces a pressure or tension in a direction that can be predetermined as a function of the crystalline structure and the regions to which the electrical voltage is applied. The structure of this piezoelectric actuator can be laid out in a number of layers, (multilayered piezoelectric actuators) in which the layers are respectively interspersed with the electrodes used to apply the electrical voltage. Such piezoelectric actuators can, for example, be used to operate on/off valves in fuel injection systems of motor vehicles.

A piezoelectric actuator of this kind is known from DE 100 26 005 A1, in which the outer electrodes are respectively distributed in a net-like or mesh-like fashion over a side surface and are contacted by the respective inner electrodes at least at points. The net-like or mesh-like outer electrodes extend beyond the multilayered structure of piezoelectric layers in such a way that the extensions serve to supply the electrical voltage via appropriate connections.

SUMMARY AND ADVANTAGES OF THE INVENTION

The piezoelectric actuator described above, with outer electrodes, which are attached in a net-like or mesh-like fashion in the form of so-called screen electrodes and are contacted by the respective inner electrodes at least at points, is advantageously modified in that the contacting of the inner electrodes is provided in the corner region; the respective net-like or mesh-like outer electrodes are guided around the respective corner in a predetermined region and contact the respective inner electrodes at least in parts.

In a particularly advantageous embodiment, the respective net-like or mesh-like outer electrode extends further in the direction of the multilayered structure of piezoelectric layers and is provided with a terminal there. It is also advantageous in this case for the extension and the terminal to be disposed in the region of the cross section of the piezoelectric actuator, i.e. on the end surface.

According to another embodiment form, the respective net-like or mesh-like outer electrode extends laterally from the piezoelectric layers and is provided with a terminal there.

In every case, the respective net-like or mesh-like outer electrode can be advantageously rolled in the region of the extension and then provided with the terminal. It is particularly advantageous in this case if the respective net-like or mesh-like outer electrode and/or the terminal is/are comprised of Invar so that the outer electrode has the same thermal expansion coefficients as the piezoelectric actuator.

The respective net-like or mesh-like outer electrode and/or terminal can also be respectively soldered or welded to the inner electrodes.

BRIEF DESCRIPTION OF THE DRAWINGS

Exemplary embodiments of the piezoelectric actuator according to the invention will be described herein below, conjunction with the drawings, in which.

DESCRIPTION OF THE PREFERRED EMBODIMENTS

Figure 1:
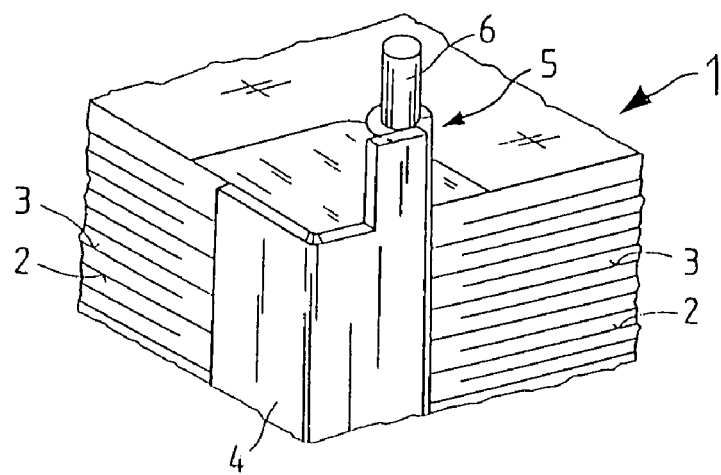
FIG. 1 shows a view of a piezoelectric actuator with a multilayered structure comprised of layers of piezoelectric ceramic and a screen-like outer electrode that extends from the end of the layer structure in order to produce a contact.

FIG. 1 shows a piezoelectric actuator 1, which is comprised in an intrinsically known way of piezoelectric sheets of a ceramic material with a suitable crystalline structure so that by making use of the so-called piezoelectric effect, the application of an external electric voltage to inner electrodes 2 and 3 via corresponding electrical connections triggers a mechanical reaction of the piezoelectric actuator 1. FIG. 1 shows one of the contacts on alternating sides—of the inner electrodes 2 in this case—in the corner region of the piezoelectric actuator 1, with a net-like, mesh-like, or screen-like outer electrode 4 that is guided around the respective corner of the piezoelectric actuator 1 in a predetermined region.

Figure 2:
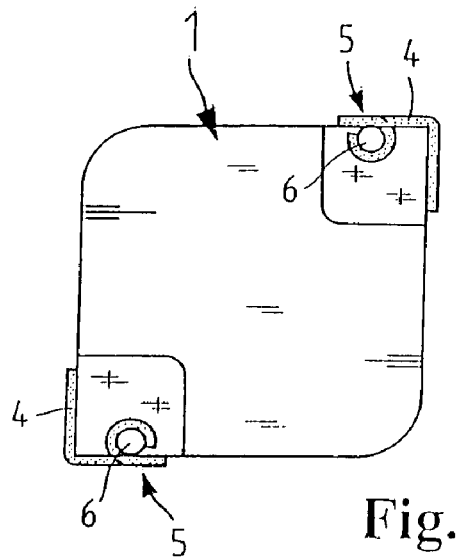
FIG. 2 is a top view of the piezoelectric actuator, with the rolled extensions of the screen-like outer electrode according to FIG. 1, with the connections for an electrical voltage.
Figure 3:
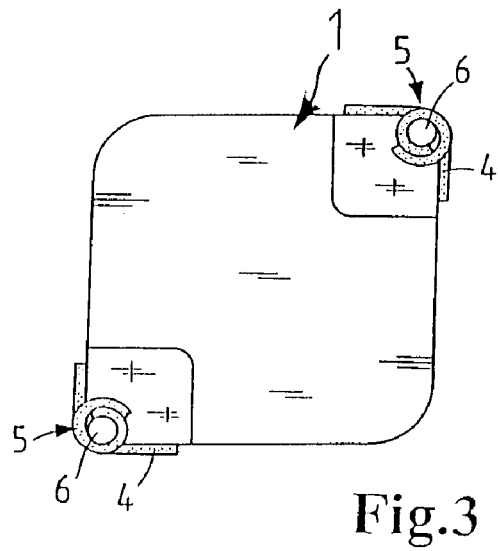
FIG. 3 shows a variant of the rolled extensions of the screen-like outer electrode, and FIGS. 4 and 5 each show a detailed view of the outer electrodes that are either soldered or welded in place.

According to FIG. 1, the outer electrode 4 extends with a region 5 beyond the end surface of the piezoelectric actuator 1 and is rolled on one side of the piezoelectric actuator 1, thus enabling contact with an electrical connection 6. FIG. 2 is a top view of this end surface. FIG. 3 shows an alternative embodiment of the rolled extension 5 in the corner region of the piezoelectric actuator 1.

Figure 4:
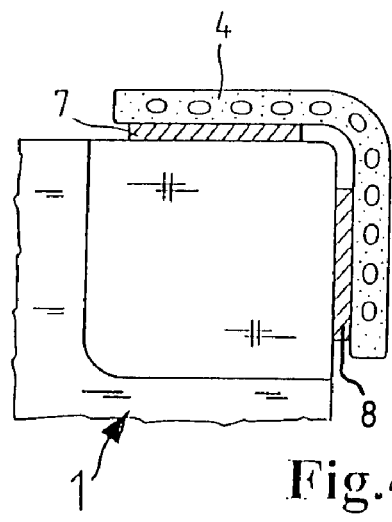
Figure 5:
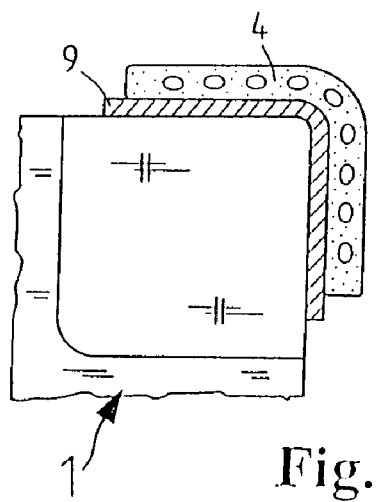

FIG. 4 is a detailed view of how the screen-like outer electrode 4 is soldered or welded to a base metallization 7 and 8 on the sides of the piezoelectric actuator 1 or, according to FIG. 5, to a base metallization 9 of the piezoelectric actuator 1 extending along the entire corner region.

The foregoing relates to a preferred exemplary embodiment of the invention, it being understood that other variants and embodiments thereof are possible within the spirit and scope of the invention, the latter being defined by the appended claims.

The invention claimed is:

1. In a piezoelectric actuator including
   a multilayered structure of piezoelectric layers with inner electrodes (2, 3) interspersed between them,
   a contacting of the inner electrodes (2, 3) on alternating sides with outer electrodes (4) that can supply an electrical voltage,
   the respective outer electrode (4) being attached in a net-like, mesh-like, or screen-like fashion and contacting the respective inner electrodes (2, 3) at least at points, the improvement wherein the contacting of the inner electrodes (2, 3) is provided in the corner region of the piezoelectric actuator (1), and the net-like, mesh-like, or screen-like outer electrode (4) being guided around the respective corner in a predetermined region, and contacting the respective inner electrodes (2, 3) at least in parts, wherein the net-like, mesh-like, or screen-like outer electrode (4) includes an extension (5) extending outwardly beyond the multilayered structure of piezoelectric layers and can be provided with a terminal (6) there, and wherein, in the region of the extension (5), the respective net-like, mesh-like, or screen-like outer electrode (4) is rolled and is provided with the terminal (6).

2. In a piezoelectric actuator including a multilayered structure of piezoelectric layers with inner electrodes (2, 3) interspersed between them, a contacting of the inner electrodes (2, 3) on alternating sides with outer electrodes (4) that can supply an electrical voltage, the respective outer electrode (4) being attached in a net-like, mesh-like, or screen-like fashion and contacting the respective inner electrodes (2, 3) at least at points, the improvement wherein the contacting of the inner electrodes (2, 3) is provided in the corner region of the piezoelectric actuator (1), and the net-like, mesh-like, or screen-like outer electrode (4) being guided around the respective corner in a predetermined region, and contacting the respective inner electrodes (2, 3) at least in parts, wherein the net-like, mesh-like, or screen-like outer electrode (4) includes an extension (5) extending outwardly beyond the multilayered structure of piezoelectric layers and can be provided with a terminal (6) there, wherein the extension (5) and the terminal (6) are disposed in the region of the cross section of the piezoelectric actuator (1), and wherein in the region of the extension (5), the respective net-like, mesh-like, or screen-like outer electrode (4) is rolled and is provided with the terminal (6).

3. In a piezoelectric actuator including a multilayered structure of piezoelectric layers with inner electrodes (2, 3) interspersed between them, a contacting of the inner electrodes (2, 3) on alternating sides with outer electrodes (4) that can supply an electrical voltage, the respective outer electrode (4) being attached in a net-like, mesh-like, or screen-like fashion and contacting the respective inner electrodes (2, 3) at least at points, the improvement wherein the contacting of the inner electrodes (2, 3) is provided in the corner region of the piezoelectric actuator (1), and the net-like, mesh-like, or screen-like outer electrode (4) being guided around the respective corner in a predetermined region, and contacting the respective inner electrodes (2, 3) at least in parts, wherein the respective net-like, mesh-like, or screen-like outer electrode extends laterally from the piezoelectric layers and is provided with a terminal there, and wherein in the region of the extension (5), the respective net-like, mesh-like, or screen-like outer electrode (4) is rolled and is provided with the terminal (6).

4. The piezoelectric actuator according to claim 1, wherein the respective net-like, mesh-like, or screen-like outer electrode (4) and/or the terminal (6) is/are made of Invar.

5. The piezoelectric actuator according to claim 2, wherein the respective net-like, mesh-like, or screen-like outer electrode (4) and/or the terminal (6) is/are made of Invar.

6. The piezoelectric actuator according to claim 3, wherein the respective net-like, mesh-like, or screen-like outer electrode (4) and/or the terminal (6) is/are made of Invar.

7. The piezoelectric actuator according to claim 1, wherein the respective net-like, mesh-like, or screen-like outer electrode (4) and/or the terminal (6) is/are soldered to the respective inner electrodes (2, 3).

8. The piezoelectric actuator according to claim 2, wherein the respective net-like, mesh-like, or screen-like outer electrode (4) and/or the terminal (6) is/are soldered to the respective inner electrodes (2, 3).

9. The piezoelectric actuator according to claim 3, wherein the respective net-like, mesh-like, or screen-like outer electrode (4) and/or the terminal (6) is/are soldered to the respective inner electrodes (2, 3).

10. The piezoelectric actuator according to claim 4, wherein the respective net-like, mesh-like, or screen-like outer electrode (4) and/or the terminal (6) is/are soldered to the respective inner electrodes (2, 3).

11. The piezoelectric actuator according to claim 5, wherein the respective net-like, mesh-like, or screen-like outer electrode (4) and/or the terminal (6) is/are soldered to the respective inner electrodes (2, 3).

12. The piezoelectric actuator according to claim 6, wherein the respective net-like, mesh-like, or screen-like outer electrode (4) and/or the terminal (6) is/are soldered to the respective inner electrodes (2, 3).

13. In a piezoelectric actuator including a multilayered structure of piezoelectric layers with inner electrodes (2, 3) interspersed between them, a contacting of the inner electrodes (2, 3) on alternating sides with outer electrodes (4) that can supply an electrical voltage, the respective outer electrode (4) being attached in a net-like, mesh-like, or screen-like fashion and contacting the respective inner electrodes (2, 3) at least at points, the improvement wherein the contacting of the inner electrodes (2, 3) is provided in the corner region of the piezoelectric actuator (1), and the net-like, mesh-like, or screen-like outer electrode (4) being guided around the respective corner in a predetermined region, and contacting the respective inner electrodes (2, 3) at least in parts, wherein the respective net-like, mesh-like, or screen-like outer electrode (4) and/or the terminal (6) is/are welded to the respective inner electrodes (2, 3).

14. The piezoelectric actuator according to claim 1, wherein the respective net-like, mesh-like, or screen-like outer electrode (4) and/or the terminal (6) is/are welded to the respective inner electrodes (2, 3).

15. The piezoelectric actuator according to claim 2, wherein
the respective net-like, mesh-like, or screen-like outer electrode (4) and/or the terminal (6) is/are welded to the respective inner electrodes (2, 3).

16. The piezoelectric actuator according to claim 3, wherein
the respective net-like, mesh-like, or screen-like outer electrode (4) and/or the terminal (6) is/are welded to the respective inner electrodes (2, 3).

17. The piezoelectric actuator according to claim 4, wherein
the respective net-like, mesh-like, or screen-like outer electrode (4) and/or the terminal (6) is/are welded to the respective inner electrodes (2, 3).

18. The piezoelectric actuator according to claim 5, wherein
the respective net-like, mesh-like, or screen-like outer electrode (4) and/or the terminal (6) is/are welded to the respective inner electrodes (2, 3).

* * * * *